(12) United States Patent
Johnson et al.

(10) Patent No.: US 8,525,519 B2
(45) Date of Patent: Sep. 3, 2013

(54) ALGORITHM FOR DETERMINING THE CAPACITY OF A BATTERY WHILE IN SERVICE

(75) Inventors: Kurt M. Johnson, Brighton, MI (US); Gregory E. Smith, Toledo, OH (US); Damon R. Frisch, Troy, MI (US); Brian J. Koch, Berkley, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 373 days.

(21) Appl. No.: 13/028,956

(22) Filed: Feb. 16, 2011

(65) Prior Publication Data
US 2012/0133369 A1 May 31, 2012

Related U.S. Application Data

(60) Provisional application No. 61/418,265, filed on Nov. 30, 2010.

(51) Int. Cl.
*H01M 10/44* (2006.01)
*H01M 10/46* (2006.01)

(52) U.S. Cl.
USPC .......................................................... 324/427

(58) Field of Classification Search
USPC ................. 320/107, 132, 149; 324/426, 427, 324/430, 433; 429/90, 91; 340/635, 636.1, 340/636.12, 636.18
See application file for complete search history.

(56) References Cited

U.S. PATENT DOCUMENTS

| | | | |
|---|---|---|---|
| 2006/0220619 A1* | 10/2006 | Namba et al. | 320/149 |
| 2008/0238371 A1* | 10/2008 | Tamezane | 320/134 |
| 2011/0248677 A1* | 10/2011 | Shimizu | 320/118 |

* cited by examiner

*Primary Examiner* — Edward Tso
(74) *Attorney, Agent, or Firm* — John A. Miller; Miller IP Group, PLC

(57) ABSTRACT

A method for estimating the capacity of a vehicle battery while in service. The method includes providing a previous battery state-of-charge, battery temperature and integrated battery current amp-hours, and determining that battery contactors have been closed after they have been opened and disconnected from a load. The method determines if the battery has been at rest for a long enough period of time while the contactors were open, where the battery rest time is based on battery temperature, and determines an initial battery voltage from a last time step when the battery contactors were closed prior to the contactors being open during the battery rest time. The method determines a present battery state-of-charge from the initial battery voltage and the battery temperature and calculates the battery capacity based on the battery integrated current amp-hours divided by the difference between the present battery state-of-charge and the previous battery state-of-charge.

18 Claims, 4 Drawing Sheets

ALGORITHM FOR DETERMINING THE CAPACITY OF A BATTERY WHILE IN SERVICE

CROSS-REFERENCE TO RELATED APPLICATIONS

This application claims the benefit of the filing date of U.S. Provisional Application No. 61/418,265, titled Algorithm for Determining the Capacity of a Battery While in Service, filed Nov. 30, 2010.

BACKGROUND OF THE INVENTION

1. Field of the Invention

This invention relates generally to a system and method for estimating battery capacity and, more particularly, to a system and method for estimating battery capacity while the battery is in service, where the method includes dividing integrated current amp-hours from a previous drive cycle by a change in battery state-of-charge (SOC) between the previous drive cycle and a current drive cycle after the battery has rested for a predetermined period of time that is based on temperature.

2. Discussion of the Related Art

Electric vehicles are becoming more and more prevalent. These vehicles include hybrid vehicles, such as the extended range electric vehicles (EREV), that combine a battery and a main power source, such as an internal combustion engine, fuel cell systems, etc., and electric only vehicles, such as the battery electric vehicles (BEV). All of these types of electric vehicles employ a high voltage battery that includes a number of battery cells. These batteries can be different battery types, such as lithium-ion, nickel metal hydride, lead-acid, etc. A typical high voltage battery system for an electric vehicle may include a large number of battery cells or modules including several battery cells to meet the vehicle power and energy requirements. The battery system can include individual battery modules where each battery module may include a certain number of battery cells, such as twelve cells. The individual battery cells may be electrically coupled in series, or a series of cells may be electrically coupled in parallel, where a number of cells in the module are connected in series and each module is electrically coupled to the other modules in parallel. Different vehicle designs include different battery designs that employ various trade-offs and advantages for a particular application.

When a battery pack is relatively new, each cell in the battery pack typically operates at about the same level of performance, i.e., maximum charge or capacity. However, as the battery pack ages over time, each cell typically degrades in performance differently than the other cells, where the performance of the battery pack is limited by the performance of the lowest performing cell. Further, a battery cell or battery module in the battery pack may fail or may otherwise be limited in performance for other reasons, such as an internal short, loss of capacity, high resistance, high temperature, etc.

The control algorithms in an electric vehicle typically need to know the capacity of the battery to track or determine battery SOC as the battery ages for battery end of life concerns. Known algorithms that estimate battery capacity have heretofore been less effective than they should be because it is typically difficult to know whether the various inputs for making the calculations to determine battery capacity are valid or proper at any particular point in time.

SUMMARY OF THE INVENTION

In accordance with the teachings of the present invention, a system and method are disclosed for estimating the capacity of a vehicle battery, where the method uses a change in battery SOC between drive cycles and integrated current amp-hours after the battery has rested for a predetermined period of time based on temperature. The method includes providing battery data including a previous battery state-of-charge, battery temperature and integrated battery current amp-hours, and determining that battery contactors have been closed after they have been opened and disconnected from a load. The method determines if the battery has been at rest for a long enough period of time while the contactors were open, where the battery rest time is based on battery temperature, and determines an initial battery voltage from a last time step when the battery contactors were closed prior to the contactors being open during the battery rest time. The method determines a present battery state-of-charge from the initial battery voltage and the battery temperature, and calculates the battery capacity based on the battery integrated current amp-hours divided by the difference between the present battery state-of-charge and the previous battery state-of-charge.

Additional features of the present invention will become apparent from the following description and appended claims, taken in conjunction with the accompanying drawings.

DETAILED DESCRIPTION OF THE EMBODIMENTS

The following discussion of the embodiments of the invention directed to a system and method for estimating battery capacity is merely exemplary in nature, and is in no way intended to limit the invention or its applications or uses. For example, the present invention has particular application for estimating the capacity of a high voltage vehicle battery. However, as will be appreciated by those skilled in the art, the method for estimating battery capacity discussed herein will have application for other types of batteries and for other applications.

Figure 1:
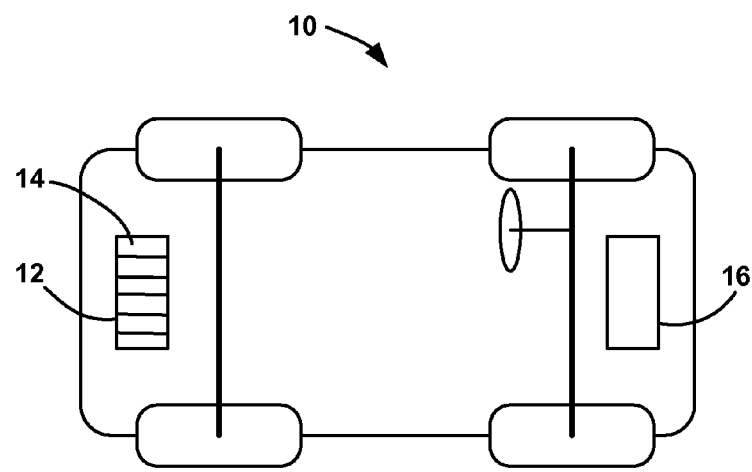
FIG. 1 is an illustration of an electric hybrid vehicle.

FIG. 1 is a top plan view of a vehicle 10 intended to represent an electric vehicle or an electric hybrid vehicle. The vehicle 10 includes a high voltage battery 12 mounted to a suitable support within the vehicle 10, where the battery 12 includes a plurality of battery cells 14. The battery 12 can be any battery suitable for an electric vehicle, such as a lead-acid battery, lithium-ion battery, metal hydride battery, etc. The vehicle 10 may also include a separate power source 16, such as an internal combustion engine, fuel cell system, etc.

Figure 2:
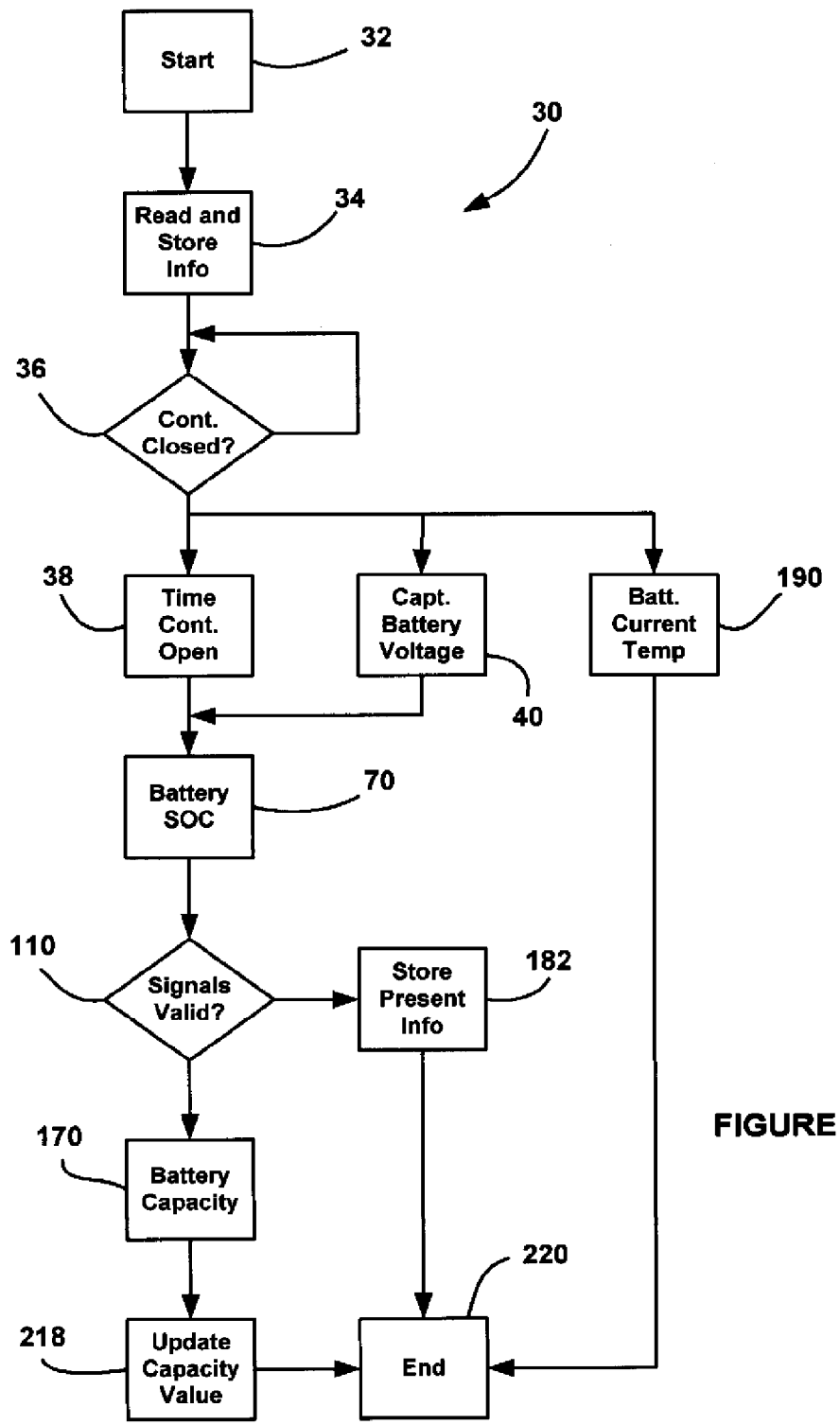
FIG. 2 is a flow chart diagram showing a method for estimating battery capacity.

FIG. 2 is a flow chart diagram 30 showing a process for an algorithm for estimating battery capacity after the battery 12 has rested for a predetermined period of time, where that time is based on battery temperature. The algorithm starts at box 32 and at box 34 reads and separately stores from memory the data and information from a previous drive cycle of the vehicle 10 that are necessary to make the various battery capacity determinations and calculations discussed herein. This data includes battery current and voltage, an integration of battery current in amp-hours over the drive cycle, i.e., the amount of battery current used during the previous drive cycle, a previous battery SOC at the beginning of the drive cycle, average battery temperature over the drive cycle, length of time of the drive cycle, and various ratios of currents that determine if the drive cycle used low current for a time frame that is not valid for accurately estimating the battery capacity. The current ratios are used because automotive current sensors are typically not accurate enough at low current, which could provide a current reading that is not suitable for battery capacity estimation. At this point in time, the battery contactors have been opened to disconnect the battery from the vehicle 10 after the previous drive cycle and the vehicle is off.

The algorithm monitors whether the contactors have been closed at decision diamond 36 for the next drive cycle of the vehicle 10 at predetermined time intervals to determine whether the battery 12 has been connected to a high voltage bus. When the contactors are closed at the decision diamond 36 to operate the vehicle 10, the algorithm determines the time the battery 12 has been in the open circuit condition with the contactors open since the previous drive cycle at box 38 to determine if the battery 12 has rested for a long enough time to achieve equilibrium and be stable, where the battery voltage would be the same as the battery SOC, to provide an accurate battery capacity calculation. This time and the stored battery temperature are compared to values in a previously populated look-up table, where the look-up table gives the proper equilibrium time for the battery 12 based on temperature. The lower the battery temperature, the longer it will take the battery 12 to reach equilibrium. If the battery 12 has "rested" long enough to achieve equilibrium at the particular battery temperature, a battery rest flag is set true, which allows the battery capacity estimation to be performed. If the battery 12 has not rested long enough to achieve equilibrium, then the calculations for estimating battery capacity are not performed for this drive cycle because they will not be accurate enough.

Figure 3:
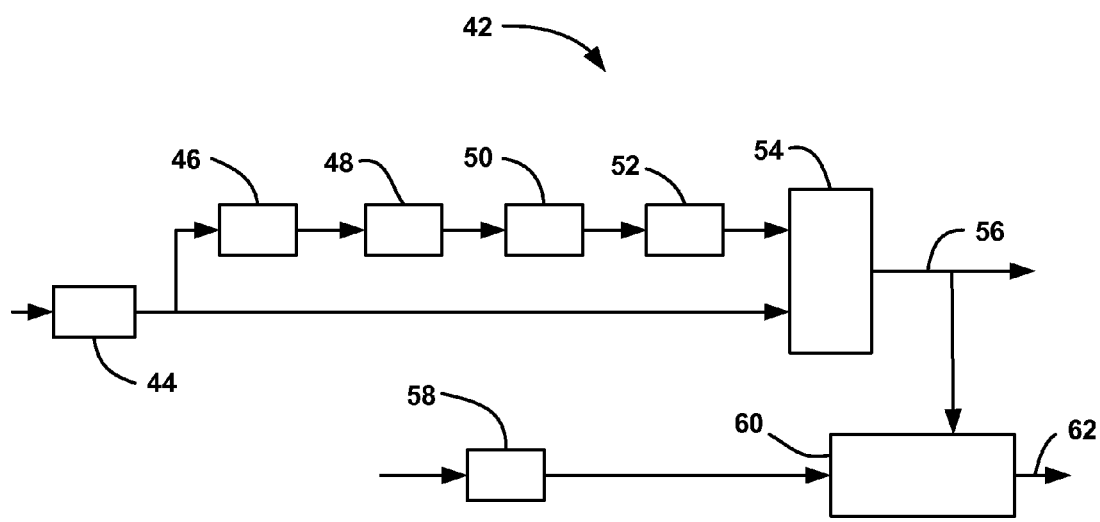
FIG. 3 is a logic block diagram showing an operation for capturing battery voltage when battery contactors are closed.

At box 40, when the contactors have been closed, the algorithm captures the battery voltage from the time step before the contactors were closed and sets it as an initial battery voltage for the present drive cycle of the battery capacity estimation. FIG. 3 is a logic block diagram 42 showing this operation. When the contactors are closed at logic box 44, a rising edge trigger at box 46 goes high, and then returns low. The output of the edge trigger is only true when the input of the trigger transitions to true, and then the trigger returns to false until the next transition. The triggered contactor closed signal is inverted at box 48, latched at box 50 and delayed one time step at box 52. The inverted and delayed contactor closed signal and the actual contactor closed signal are logically ANDed at box 54 to set an end open circuit flag true on line 56 indicating that the contactors are closed. The battery voltage is delayed one time period at box 58, and when the end open circuit flag is set true, the algorithm captures the delayed battery voltage at box 60 as the initial battery voltage provided on line 62 for the capacity estimations.

Figure 4:
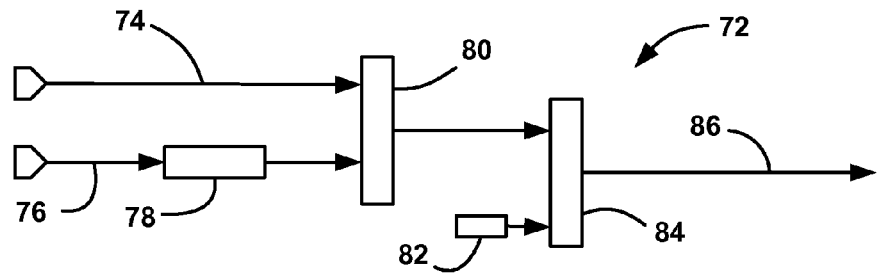
FIG. 4 is a logic block diagram showing an operation for determining battery SOC.

If the battery rest flag is set true at the box 38 in the flow diagram 30 and the initial battery voltage is determined at the box 40 when the contactors are closed, then the algorithm uses a look-up table at box 70 to determine the battery SOC from the initial battery voltage and the current battery temperature. FIG. 4 is a logic block diagram 72 showing an operation for determining the battery SOC, where the battery temperature is provided on line 74 and the initial battery voltage is provided on line 76. The battery pack voltage is connected to a battery cell voltage at box 78, and the temperature and battery cell voltage are applied to box 80 that provides a calibration for the battery SOC based on temperature. The calibrated battery SOC is multiplied at box 84 by 100 provided at box 82 to get a percentage of the battery SOC from the look-up table on line 86.

Figure 5:
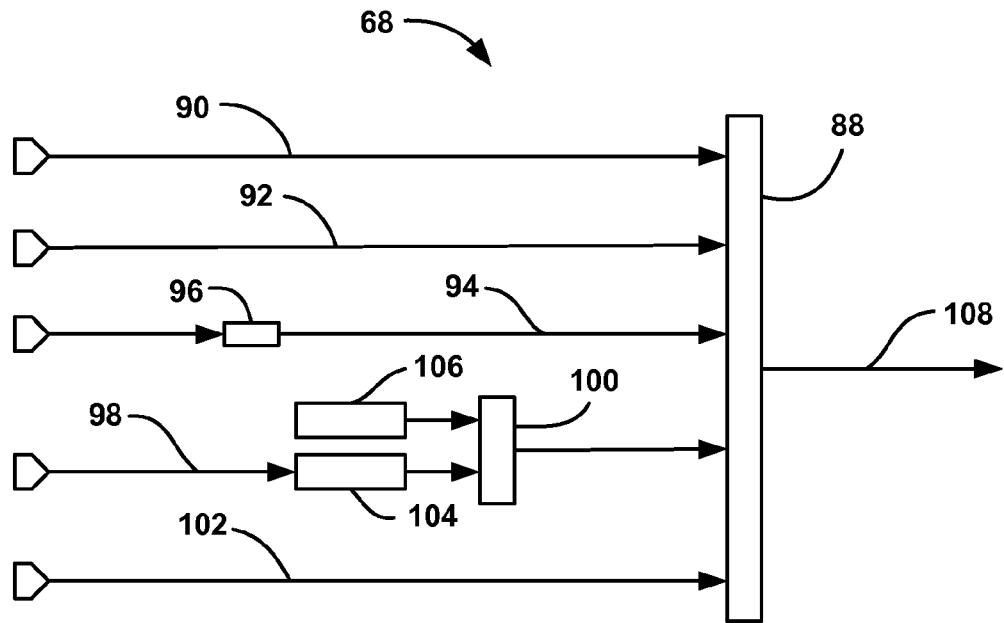
FIG. 5 is a logic block diagram showing an operation for determining if the battery SOC is valid.

FIG. 5 is a logic block diagram 68 for determining if the battery SOC is valid and can be used for accurately determining the battery capacity. The algorithm determines if the percentage of the battery SOC is valid by determining whether five input values are valid or set true, where the values are logically ANDed at box 88. Those validity determining inputs include whether the temperature is valid on line 90, whether the initial battery voltage is valid on line 92, that the battery current is not fault active on line 94, which is inverted at box 96, that the battery current on line 98 is less than a current calibration at box 100 and that the rest flag is high on line 102. An absolute value of the battery current on the line 98 is provided at box 104, and the current threshold value for the logic determination at the box 100 is provided at box 106. If all of these signals applied to the AND box 88 are high, then the battery SOC is valid, where a valid SOC flag is set high on line 108.

Figure 6:
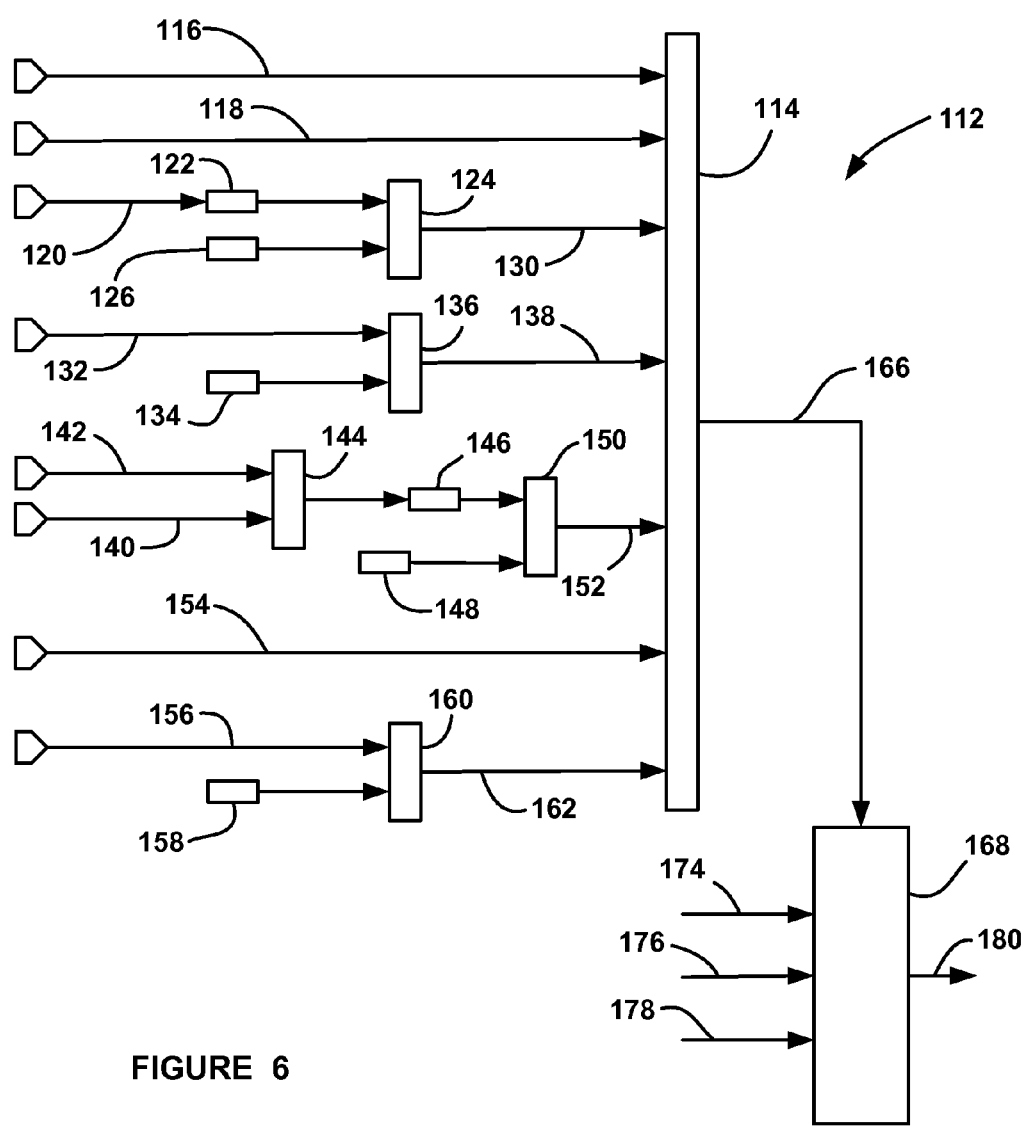
FIG. 6 is a logic block diagram showing an operation for determining whether battery data is valid for calculating battery capacity.

Returning to the flow chart diagram 30, the algorithm then uses all of these validity flags, and previously determined validity values, to determine whether the various signals needed to estimate battery capacity are valid at decision diamond 110. FIG. 6 is a logic block diagram 112 that makes this validity determination through a logic AND box 114 using the inputs discussed above. A previous usable battery SOC value from the last capacity estimation process from the previous drive cycle is provided on line 116 and the present useable battery SOC from the line 108 is provided on line 118. The last battery integrated current amp-hours from the previous drive cycle is provided on line 120, and its absolute value at box 122 is provided to box 124 that determines whether it is greater than a calibrated value provided at box 126, and if so, sets a valid flag on line 130 to make sure that the integrated current amp-hours has changed enough for an accurate capacity estimation.

A previous count value is provided on line 132 and a count calibration value is provided at box 134, and if the previous count value is less than the calibration count value at box 136, then a count valid flag is set high on line 138. The previous amount of time accumulated from the previous drive cycle needs to be less than a predetermined calibrated value so that the count is not from to long of a time. The previous battery SOC on line 140 is subtracted from the present battery SOC on line 142 at box 144, and the absolute value of this difference from box 146 is compared at box 150 to a minimum delta battery SOC provided at box 148 to make sure that there has been a large enough change in the battery SOC for an accurate capacity estimation. If the difference between the two battery SOCs is greater than a predetermined threshold, then a delta battery SOC flag is set high on line 152. The battery rest flag is provided on line 154 to the AND box 114. A previous low current amp-hours ratio is provided on line 156 and is compared at box 160 to a threshold amp-hours ratio provided at box 158, and if the previous integrated current amp-hours is less than the threshold, then a previous integrated amp-hours ratio valid signal is set high on line 162. If all of the inputs to the logic AND box 114 are high, then all of the values necessary to calculate the battery capacity are valid, which is indicated by a high value on line 166.

The battery capacity is calculated by the algorithm in the flow chart diagram at box 170 as the battery integrated current amp-hours for the previous drive cycle divided by the difference between the present battery SOC and the previous battery SOC. If all of these inputs to the AND box 114 are high or true, then the valid flag on the line 166 is set that allows the capacity calculation to be performed at box 168. This operation is shown in the logic diagram 112 where the last integrated current amp-hours is provided on line 174, the previous battery SOC is provided on line 176 and the present battery SOC is provided on line 178. The estimated battery capacity is output from the box 168 on line 180. If all of the inputs to the AND box 114 are not set high, then the algorithm discards the past drive information and stores the present information as the past information at box 182 in the flow chart diagram 30.

Figure 7:
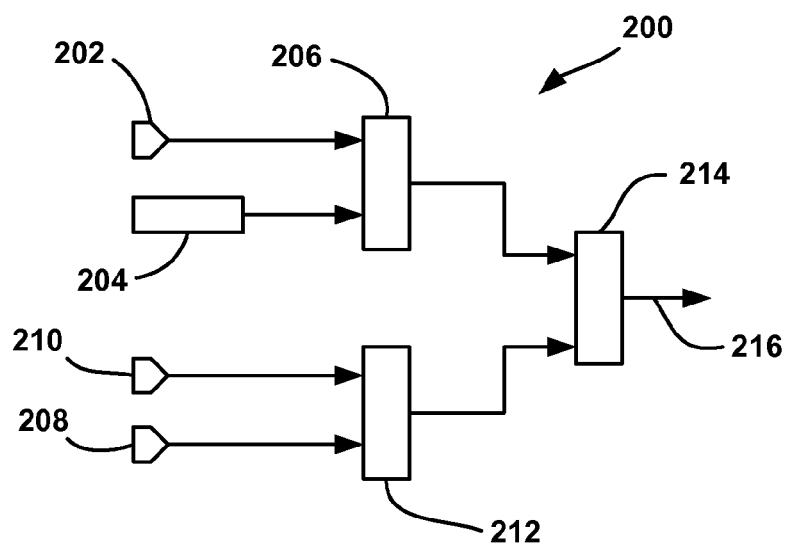
FIG. 7 is a logic block diagram showing an operation for estimating battery capacity.

FIG. 7 is a logic block diagram 200 showing a logic operation for determining the battery capacity as the integrated current amp-hours divided by the difference between the present battery SOC and the past battery SOC. The last integrated current amp-hours is provided on line 202 and is multiplied at box 206 by 100 provided on line 204. The previous battery SOC on line 208 is subtracted at box 212 from the present battery SOC on line 210, and the last integrated current amp-hours is divided by the change in battery SOC at box 214. The absolute value of the battery capacity is provided at box 216 and is then used to update the capacity value in the vehicle memory at box 218 in the flow chart diagram 30. The algorithm then ends at box 220.

When the contactors are closed at the decision diamond 36, the algorithm also accumulates the battery current and temperature during the new drive cycle at box 190 and stores it in memory for the next drive cycle, which will be read from memory at the box 34 for the new calculation of the battery capacity estimation.

The foregoing discussion disclosed and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A method for estimating capacity of a battery, said method comprising:
   providing, in a processor, battery data including a previous battery state-of-charge, battery voltage, battery temperature and integrated battery current amp-hours;
   determining, in the processor, that battery contactors have been closed after the contactors have been opened to disconnect the battery from a load;
   determining, in the processor, if the battery has been at rest for a long enough period of time while the contactors were open where the battery rest time is based on battery temperature;
   determining, in the processor, an initial battery voltage as a battery voltage from a last time step when the battery contactors were closed prior to the contactors being open during the battery rest time;
   determining, in the processor, a present battery state-of-charge from the initial battery voltage and the battery temperature; and
   calculating, in the processor, the battery capacity based on the integrated battery current amp-hours divided by the difference between the present battery state-of-charge and the previous battery state-of-charge.

2. The method according to claim 1 wherein the battery is a high voltage vehicle battery and the load is a vehicle load on a vehicle.

3. The method according to claim 2 wherein providing battery data includes providing the previous battery state-of-charge and the integrated battery current amp-hours for a previous drive cycle of the vehicle, an average battery temperature over the drive cycle and a length of time of the previous vehicle drive cycle.

4. The method according to claim 2 wherein calculating the battery capacity includes determining that the calculated capacity is a valid capacity.

5. The method according to claim 4 wherein determining if the battery capacity is valid includes determining that the time from the previous drive cycle is less than a first predetermined time threshold, determining that the difference between the present battery state-of-charge and the previous battery state-of-charge is greater than a predetermined minimum threshold, determining that the battery has been in a rest condition for longer than a predetermined second time threshold and determining that the battery current amp-hours is less than a predetermined current threshold.

6. The method according to claim 1 wherein determining a present battery state-of-charge includes determining whether the present battery state-of-charge is a valid state-of-charge, and if the present battery state-of-charge is not valid, then preventing calculation of the battery capacity.

7. The method according to claim 6 wherein determining if the present battery state-of-charge is valid includes determining that the battery temperature is a valid temperature, that the initial battery voltage is a valid voltage, that the battery current is not in a fault active condition, that the battery current is less than a predetermined current calibration value and that the battery has been in a rest condition for longer than a predetermined time threshold.

8. A method for estimating a capacity of a high voltage vehicle battery in a vehicle, said method comprising:
   providing, in a processor, battery data including a previous battery state-of-charge for a previous drive cycle of the vehicle, an integrated battery current amp-hours for the previous drive cycle of the vehicle, battery voltage and battery temperature;
   determining, in the processor, that battery contactors have been closed after the contactors have been opened to disconnect the battery from a high voltage vehicle bus;
   determining, in the processor, if the battery has been at rest for a long enough period of time while the contactors were open where the rest time is based on battery temperature;
   determining, in the processor, an initial battery voltage as a battery voltage from a last time step when the battery contactors were closed prior to the contactors being opened during the battery rest time;
   determining, in the processor, a present battery state-of-charge from the initial battery voltage and the battery temperature;
   determining, in the processor, whether the present battery state-of-charge is a valid state-of-charge; and
   calculating, in the processor, the battery capacity based on the integrated battery current amp-hours divided by the difference between the present battery state-of-charge and previous battery state-of-charge if the present battery state-of-charge is valid.

9. The method according to claim 8 wherein calculating the battery capacity includes determining that the calculated capacity is a valid capacity.

10. The method according to claim 9 wherein determining if the battery capacity is valid includes determining that the time from the previous drive cycle is less than a first predetermined time threshold, determining that the difference between the present battery state-of-charge and the previous battery state-of-charge is greater than a predetermined minimum threshold, determining that the battery has been in a rest condition for longer than a second predetermined time threshold and determining that the battery current amp-hour is less than a predetermined current threshold.

11. The method according to claim 8 wherein determining if the present battery state-of-charge is valid includes determining that the battery temperature is a valid temperature, that the initial battery voltage is a valid voltage, that the battery current is not in a fault active condition, that the battery current is less than a predetermined current calibration value and that the battery has been in a rest condition for longer than a predetermined time threshold.

12. A system for estimating capacity of a battery, said system comprising:

means for providing battery data including a previous battery state-of-charge, battery voltage, battery temperature and integrated battery current amp-hours;

means for determining that battery contactors have been closed after the contactors have been opened to disconnect the battery from a load;

means for determining if the battery has been at rest for a long enough period of time while the contactors were open where the battery rest time is based on battery temperature;

means for determining an initial battery voltage as a battery voltage from a last time step when the battery contactors were closed prior to the contactors being opened during the battery rest time;

means for determining a present battery state-of-charge from the initial battery voltage and the battery temperature; and means for calculating the battery capacity based on the integrated battery current amp-hours divided by the difference between the present battery state-of-charge and the previous battery state-of-charge.

13. The system according to claim 12 wherein the battery is a high voltage vehicle battery and the load is a vehicle load on a vehicle.

14. The system according to claim 13 wherein the means for providing battery data provides the previous battery state-of-charge and the integrated battery current amp-hours for a previous drive cycle of the vehicle, an average battery temperature over the drive cycle and a length of time of the previous vehicle drive cycle.

15. The system according to claim 13 wherein the means for calculating the battery capacity determines that the calculated capacity is a valid capacity.

16. The system according to claim 15 wherein the means for calculating the battery capacity determines if the battery capacity is valid by determining that the time from the previous drive cycle is less than a first predetermined time threshold, determining that the difference between the present battery state-of-charge and the previous battery state-of-charge is greater than a predetermined minimum threshold, determining that the battery has been in a rest condition for longer than a second predetermined time threshold and determining that the battery current amp-hours is less than a predetermined current threshold.

17. The system according to claim 12 wherein the means for determining a present battery state-of-charge determines whether the present battery state-of-charge is a valid state-of-charge, and if the present battery state-of-charge is not valid, then preventing calculation of the battery capacity.

18. The system according to claim 17 wherein the means for determining a present battery state-of-charge determines whether the present battery state-of-charge is a valid state-of-charge by determining that the battery temperature is a valid temperature, that the initial battery voltage is a valid voltage, that the battery current is not in a fault active condition, that the battery current is less than a predetermined current calibration value and that the battery has been in a rest condition for longer than a predetermined time threshold.

\* \* \* \* \*